United States Patent
Chen et al.

(10) Patent No.: US 10,833,540 B2
(45) Date of Patent: Nov. 10, 2020

(54) Q-FACTOR DETERMINATION FOR FOREIGN OBJECT DETECTION CIRCUIT IN WIRELESS CHARGING SYSTEM

(71) Applicant: NXP USA, INC., Austin, TX (US)

(72) Inventors: Fei Chen, Shanghai (CN); Li Wang, Suzhou (CN); Gang Li, Shanghai (CN); Dengyu Jiang, Suzhou (CN); Dechang Wang, Suzhou (CN)

(73) Assignee: NXP USA, Inc., Austin, TX (US)

(*) Notice: Subject to any disclaimer, the term of this patent is extended or adjusted under 35 U.S.C. 154(b) by 109 days.

(21) Appl. No.: 16/244,059

(22) Filed: Jan. 9, 2019

(65) Prior Publication Data

US 2020/0185974 A1  Jun. 11, 2020

(30) Foreign Application Priority Data

Dec. 11, 2018 (CN) .......................... 2018 1 1506972

(51) Int. Cl.
| | |
|---|---|
| *H02J 7/00* | (2006.01) |
| *H02J 50/60* | (2016.01) |
| *H02J 7/02* | (2016.01) |
| *G01R 27/26* | (2006.01) |
| *H02M 7/5387* | (2007.01) |
| *H02J 50/12* | (2016.01) |

(52) U.S. Cl.
CPC .......... *H02J 50/60* (2016.02); *G01R 27/2688* (2013.01); *H02J 7/025* (2013.01); *H02J 50/12* (2016.02); *H02M 7/5387* (2013.01)

(58) Field of Classification Search
CPC ............. H02J 50/60; H02J 50/12; H02J 7/025

USPC ........................................................ 320/108
See application file for complete search history.

(56) References Cited

U.S. PATENT DOCUMENTS

| | | | |
|---|---|---|---|
| 5,420,518 | A  | 5/1995  | Schafer |
| 6,471,106 | B1 | 10/2002 | Reining |
| 8,983,374 | B2 | 3/2015  | Wiley |
| 9,178,387 | B2 | 11/2015 | Mohammadian et al. |
| 9,450,648 | B2 | 9/2016  | Bastami |
| 9,465,064 | B2 | 10/2016 | Roy et al. |

(Continued)

FOREIGN PATENT DOCUMENTS

| | | |
|---|---|---|
| CN | 103907119   | 2/2014 |
| CN | 205027804 U | 2/2016 |
| DE | 2443069     | 3/1975 |

OTHER PUBLICATIONS

Restriction/Election Office Action for U.S. Appl. No. 15/355,075 dated Aug. 29, 2018, 6 pages.

(Continued)

*Primary Examiner* — Suchin Parihar

(57) ABSTRACT

In a wireless charging system, a power-transmitting node (TX) has a power transmitter for transmitting power wirelessly to a power-receiving node (RX), a sampling and sensing circuit, a processor, and a signal receiver for receiving signals from the RX. The processor detects the presence of a foreign object (FO) during a power-transfer session using Quality Factor (QF) values. Estimated QF parameters are determined via exponential curve fitting using peak values of a damped sinusoidal waveform generated by a resonant circuit. Then the estimated parameters in the exponential curve are used to calculate the QF, which provides a robust measurement result even in a noisy environment.

12 Claims, 4 Drawing Sheets

(56) References Cited

U.S. PATENT DOCUMENTS

| | | |
|---|---|---|
| 9,474,031 B1 | 10/2016 | Sedzin et al. |
| 9,530,558 B2 | 12/2016 | Nakano et al. |
| 9,806,542 B2 | 10/2017 | Asanuma et al. |
| 9,851,399 B2 | 12/2017 | Finkenzeller et al. |
| 9,966,803 B2 | 5/2018 | Wang et al. |
| 10,018,744 B2 * | 7/2018 | Roy .................. G01V 3/104 |
| 10,218,211 B2 | 2/2019 | Li et al. |
| 10,432,036 B2 | 10/2019 | Li et al. |
| 10,686,337 B2 * | 6/2020 | Roy ................ G01R 29/0814 |
| 10,763,706 B2 | 9/2020 | Chen et al. |
| 2013/0069441 A1 | 3/2013 | Verghese |
| 2013/0094598 A1 | 4/2013 | Bastami |
| 2013/0257165 A1 | 10/2013 | Singh |
| 2013/0257168 A1 | 10/2013 | Singh |
| 2014/0015329 A1 | 1/2014 | Widmer |
| 2014/0015522 A1 | 1/2014 | Widmer et al. |
| 2014/0049422 A1 | 2/2014 | Von Novak |
| 2014/0084857 A1 | 3/2014 | Liu et al. |
| 2014/0111019 A1 | 4/2014 | Roy |
| 2014/0333145 A1 | 11/2014 | Lee et al. |
| 2014/0361738 A1 | 12/2014 | Lee et al. |
| 2015/0198640 A1 | 7/2015 | Lee |
| 2015/0318708 A1 | 11/2015 | Bartlett |
| 2015/0372493 A1 | 12/2015 | Sankar |
| 2016/0028248 A1 | 1/2016 | Asanuma et al. |
| 2016/0146886 A1 | 5/2016 | Finkenzeller et al. |
| 2016/0149442 A1 * | 5/2016 | Asanuma ............ H02J 7/00302 |
| | | 307/104 |
| 2016/0190852 A1 | 6/2016 | Chiang et al. |
| 2017/0117755 A1 | 4/2017 | Muratov et al. |
| 2017/0271908 A1 | 9/2017 | Li et al. |
| 2018/0062504 A1 | 3/2018 | Mei et al. |
| 2018/0115197 A1 * | 4/2018 | Li ........................... H02J 50/80 |
| 2018/0241257 A1 * | 8/2018 | Muratov ................ H02J 50/12 |
| 2019/0140489 A1 * | 5/2019 | Liu ........................... G01V 3/38 |
| 2019/0393731 A1 * | 12/2019 | Maniktala ............. H02J 50/60 |
| 2020/0169124 A1 * | 5/2020 | Mehas ..................... G01V 3/10 |
| 2020/0212713 A1 | 7/2020 | Jiang et al. |
| 2020/0259373 A1 * | 8/2020 | Park ...................... G01R 27/26 |

OTHER PUBLICATIONS

Non-Final Office Action for U.S. Appl. No. 15/355,075 dated Sep. 19, 2018, 10 pages.

Notice of Allowance for U.S. Appl. No. 15/355,075 dated Jan. 9, 2019, 8 pages.

* cited by examiner

40

Q-FACTOR DETERMINATION FOR FOREIGN OBJECT DETECTION CIRCUIT IN WIRELESS CHARGING SYSTEM

CROSS-REFERENCE TO RELATED APPLICATIONS

This application is related to U.S. Ser. No. 15/355,075 filed on Nov. 18, 2016 and U.S. Ser. No. 16/028,378 filed on Jul. 5, 2018, both of which are assigned to NXP USA, INC.

BACKGROUND

The present invention relates generally to wireless charging systems and, more particularly, to a method and apparatus for determining a Quality (Q) factor used in the detection of foreign objects in wireless charging systems.

In a conventional wireless charging system, a power source (i.e., a power-transmitting node or TX) transmits power wirelessly via inductive coupling to a power sink (i.e., a power-receiving node or RX) that is placed on or at least near the TX in order to charge or power the RX. The inductive coupling between the TX and the RX is achieved via resonant transducer circuitry in each node having similar if not identical resonant frequencies. To determine whether an RX is present, the TX will periodically or intermittently transmit a ping message and, if present, an RX will respond to the ping message by transmitting an ack message acknowledging its presence. The TX then will respond to the ack message by transmitting power to the RX.

If a metal foreign objected (FO) is placed on or near a TX during a power-transfer session, inductive coupling between the TX and the FO may result in the generation of heat in the FO, which can cause damage to the FO, the TX, and/or the RX.

Q factor is a characteristic parameter for a resonator. When a FO is present, a measured Q factor will be different from the Q factor when no FO is present. This makes Q factor a good indication for foreign object detection (FOD). For example, when no RX and no FO are present, the TX will have a relatively high Q value. Because an RX's resonant transducer circuitry is designed to resonate at a similar frequency as a TX's resonant transducer circuitry, when an RX is present (but not an FO), the Q value will still be relatively high. However, when a random FO is present, like a coin, a key, or other metal object, then the Q value will be relatively low, whether or not an RX is also present.

There are many ways to calculate Q factor, like the voltage ratio method, the half bandwidth method, and the temporal decay method. However, these methods don't work well in noisy environments, and because of the coupling between a TX, a RX and a FO, the charging system is a noisy environment. Thus, it would be advantageous to have a robust method for calculating Q factor in a noisy environment.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Figure 1:
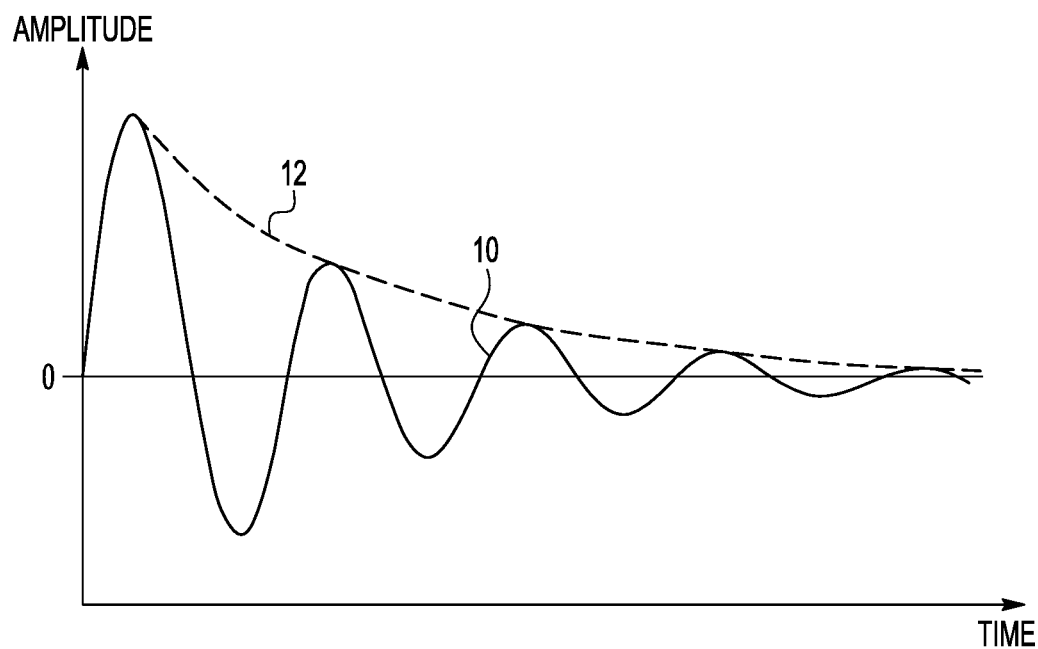
FIG. 1 is a graph showing a typical damping oscillation waveform and its envelop.

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In certain embodiments, the present invention is a transmitter (TX) for transmitting power wirelessly to a power-receiver (RX) in a wireless charging system. The TX comprises a resonator, a sampling and sensing circuit that measures peak values of a sinusoidal waveform of resonator energy, and a processor that uses the measured peak values to estimate parameters along the curve via exponential curve fitting to determine Q factor values that are used to detect the presence of a nearby foreign object (FO). The curve-fitting method allows for accurate parameter estimation, which enables robust measurement results even in noisy environments.

In one embodiment, the present invention is a machine-implemented method of determining a Q-factor of a resonant tank circuit of a power transmitting node in a wireless charging system. The method includes: exciting transitory damped oscillations of the resonant tank circuit; acquiring an array of digital signal samples that represent a waveform envelope of the transitory damped oscillations; using the samples to form a curve; and using parameters of the curve to calculate the Q-factor.

Another embodiment of the present invention is a power transmitting node of a wireless charging system, comprising a resonant converter that includes a switch network and a resonant tank circuit, a sampling and sensing circuit, and a processor operatively connected to the sampling and sensing circuit. The processor calculates a Q-factor of the resonant tank circuit by switching the switch network to excite transitory damped oscillations of the resonant tank circuit; acquiring a plurality of digital signal samples of the oscillations; defining a curve using the digital signal samples; and determining the Q-factor using parameters along the curve.

Referring now to FIG. 1, a typical damped oscillation waveform 10 and its envelop 12 are shown. A transmitter (TX) in a wireless charging system includes a resonator (LC circuit) to transmit power wirelessly to a receiver (RX). If energy is injected into the resonator, after the energy source is removed, the resonator will perform free resonance with a damping rate. The waveform 10 is a damped sine wave having an amplitude that approaches zero as time increases. That is, the waveform 10 oscillates sinusoidally, but the amplitude decreases within the envelope of a decaying exponential. The damped waveform can be used to calculate Q factor using equation (1).

$$Q = \frac{\omega_0 L}{R} = \frac{\pi}{-\ln(A)} \quad (1)$$

where A is the ratio of previous peak and next peak of the damping sinusoidal waveform. In implementation, generally three steps are used to calculate Q factor: (i) damping sinusoidal waveform period is detected with zero crossing points, (ii) adjacent peaks are searched at a certain interval of the waveform period in step 1, and (iii) equation (1) is used to calculate Q Factor using adjacent peaks.

Figure 2:
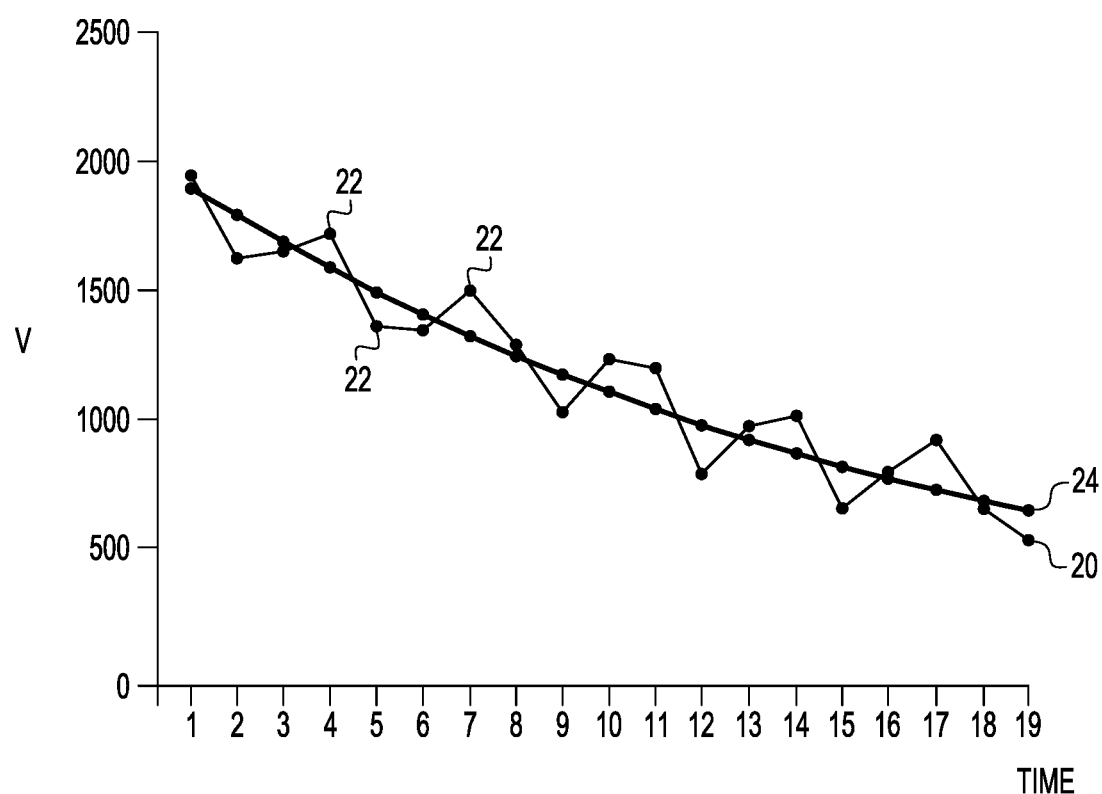
FIG. 2 is a graph showing the peaks of a distorted damping sinusoidal waveform and an estimation result for measured data in accordance with an embodiment of the present invention.

However, in some cases, the damped sinusoidal waveform is not so ideal as the one shown in FIG. 1. For example, a TX supporting 2 channels of charging can have 2 sets of coils. The energies generated by the coils interfere with each other, which distorts the waveform, making the calculated Q factor inaccurate. FIG. 2 shows the peaks of a distorted damped sinusoidal waveform 20, which illustrates peak values 22 of the curve 20, which if were used, would generate an inaccurate result for Q factor. In contrast, the line 24 shows the estimation result of real measured data, which allows for an accurate Q factor calculation. Thus, the present invention uses a curve-fitting method to generate a more accurate waveform and then extracts parameters from the generated waveform to calculate the Q factor.

Figure 3:
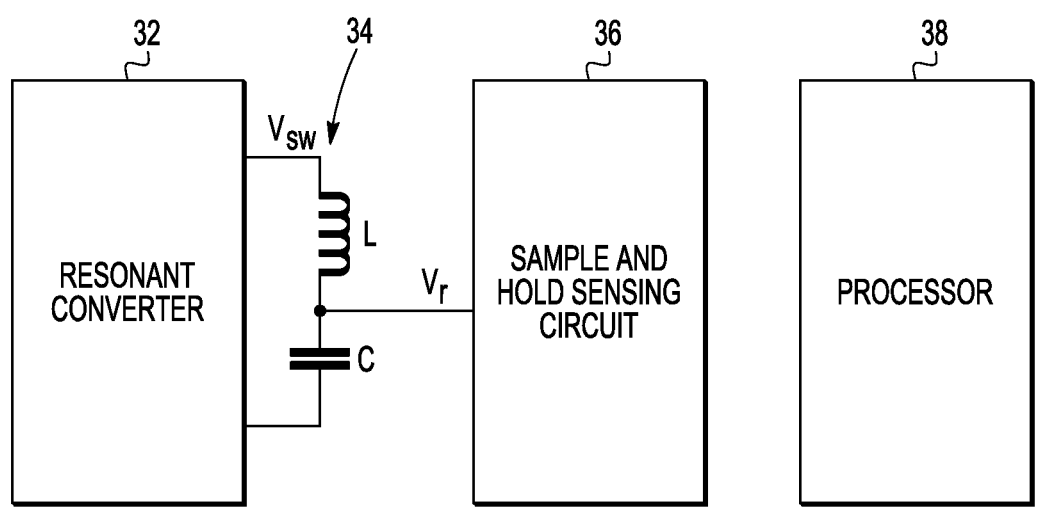
FIG. 3 is a schematic block diagram of a transmitter of a wireless charging system in accordance with an embodiment of the present invention.

FIG. 3 is a simplified schematic block diagram of a wireless charging transmitter 30 in accordance with an embodiment of the invention. The transmitter (TX) 30 includes a resonant converter 32, a tank circuit 34, a sampling and sensing circuit 36, and a processor 38. The resonant converter 32 and the tank circuit 34 are well known in the art so detailed description of these elements is deemed unnecessary for one of skill in the art to understand the invention. The resonant waveform across the capacitor C is connected to the sampling and sensing circuit 36. The sampling and sensing circuit 36 determines the period of the damping sinusoidal waveform. A sequence of peak values on the damping sinusoidal waveform are sampled and saved in a buffer for later processing. The processor 38 uses the stored data, a sequence of peaks of damping sinusoidal waveform, and performs curve fitting on the input data, defining an estimated curve. The Q factor then is calculated using parameters of the estimated curve.

Figure 4:
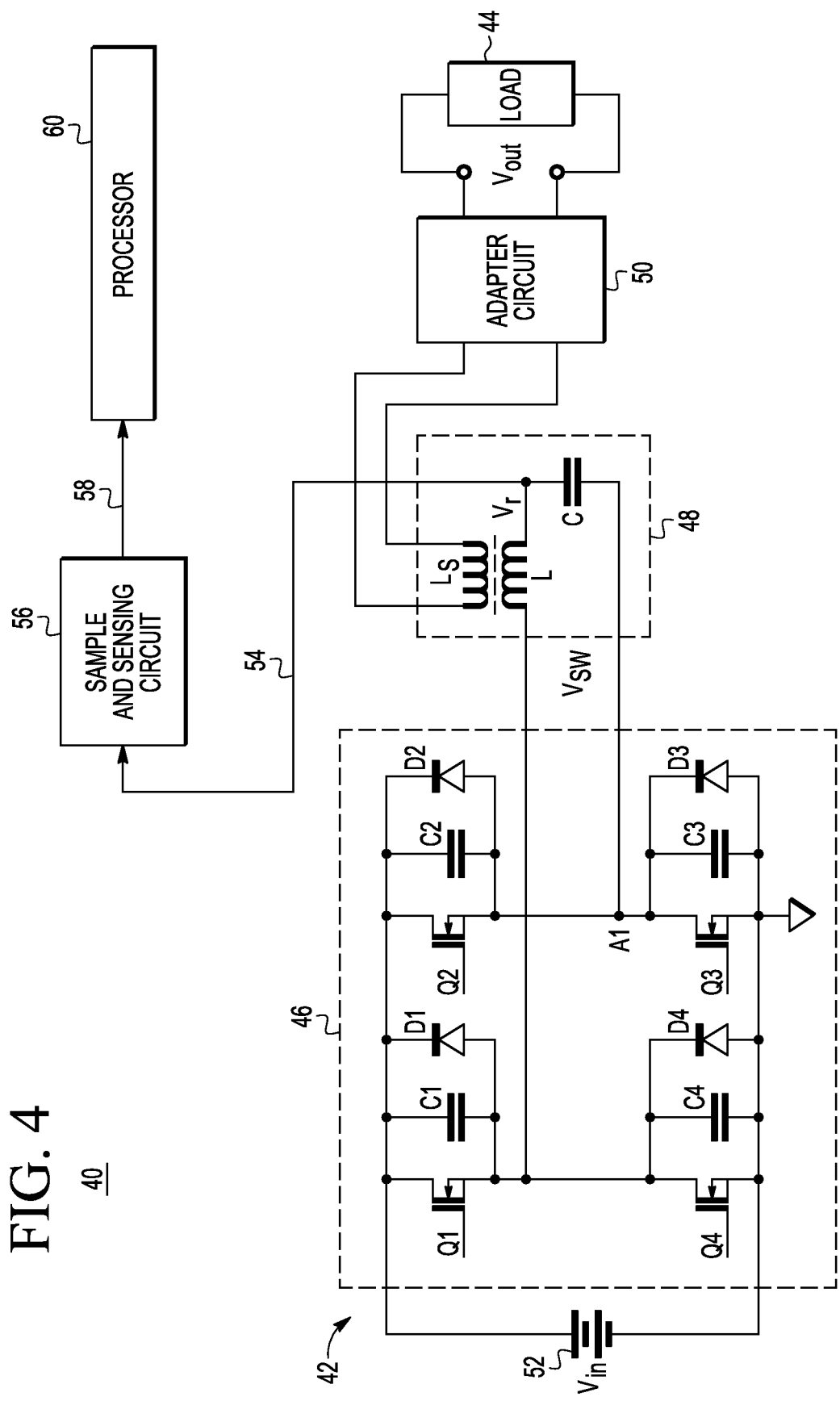
FIG. 4 is a schematic circuit diagram of a sampling and sensing circuit in accordance with an embodiment of the present invention.

FIG. 4 is schematic block diagram of a transmitter (TX) 40 for a wireless charging system according to an embodiment of the invention. The TX 40 includes a resonant converter 42 that operates as a power supply for a load 44. In particular, the resonant converter 42 operates to convert an input DC voltage ($V_{in}$) into an output voltage ($V_{out}$). Depending on the power requirements of the load 44, the resonant converter 42 can be designed such that the output voltage $V_{out}$ is either a regulated DC voltage or a regulated AC voltage.

In one embodiment, the resonant converter 42 includes a switch network 46, a resonant tank circuit 48, and an optional adapter circuit 50 that can be inductively coupled to the resonant tank circuit 48, e.g., as indicated in FIG. 4, using an auxiliary inductor $L_s$. The adapter circuit 50 can be omitted, e.g., in embodiments in which the resonant converter 42 operates as a DC-to-AC power converter. In embodiments in which the resonant converter 42 operates as a DC-DC power converter, the adapter circuit 50 may include a rectifier and a low-pass filter (not explicitly shown). In embodiments directed to wireless charging, the adapter circuit 50 may also include a coupler that enables through-space electrical coupling between the resonant converter 42 and the load 44. Some embodiments of the resonant converter 42 may include a voltage source 52. In some embodiments, the voltage source 52 may be a part of external circuits or devices (not shown).

The switch network 46 is implemented as a full-bridge inverter having four transistor switches Q1-Q4, each connected in parallel with a respective one of capacitors C1-C4 and a respective one of diodes D1-D4. In operation, the switches Q1-Q4 are turned ON and OFF to cause the full-bridge inverter to convert the input DC voltage $V_{in}$ provided by the voltage source 52 into a square waveform ($V_{sw}$) that is used to drive oscillations of the resonant tank circuit 48.

In one embodiment, the switch network 46 is implemented as a half-bridge inverter. A person of ordinary skill in the art will understand that a half-bridge inverter can be obtained from the shown full-bridge inverter, e.g., by (i) connecting the node A1 to ground and (ii) removing the transistors Q2 and Q3, capacitors C2 and C3, and diodes D2 and D3. In some embodiments, the capacitors C1-C4 and the diodes D1-D4 are optional and can be omitted. A person of ordinary skill in the art will further understand that other alternative embodiments of the switch network 46 can instead be used in the TX 40.

The square waveform $V_{sw}$ generated by the switch network 46 drives the resonant tank circuit 48 to generate a sinusoidal voltage $V_r$ having a frequency that is close (but not identical) to the resonant frequency of the resonant tank circuit 48. In various embodiments, the amplitude of the sinusoidal voltage $V_r$ can be controlled by (i) controlling the switching frequency of the transistors Q1-Q4 of the switch network 46 or (ii) with the switching frequency being fixed, controlling the duration of the ON pulses applied to the gates of the transistors Q1-Q4. In one embodiment, the train of ON pulses applied to the gates of the transistors Q1-Q4 is characterized by a relatively low duty cycle.

In one embodiment, the train of ON pulses is applied to the gates of the transistors Q1-Q4 in the following manner. The transistor pairs Q1/Q3 and Q2/Q4 are turned ON and OFF such that: (i) in a pulse cycle in which the transistors Q1 and Q3 are pulsed ON, the transistors Q2 and Q4 remain OFF, and (ii) in a pulse cycle in which the transistors Q2 and Q4 are pulsed ON, the transistors Q1 and Q3 remain OFF. In the alternative embodiment in which the switch network 46 is implemented as a half-bridge inverter, the transistors Q1 and Q4 are turned ON and OFF such that: (i) in a pulse cycle in which Q1 is pulsed ON, Q4 remains OFF, and (ii) in a pulse cycle in which Q4 is pulsed ON, Q1 remains OFF.

The resonant tank circuit 48 comprises an inductor L and a capacitor C that are connected in series. A person of ordinary skill in the art will understand that alternative embodiments of the tank circuit 48 can be used in the TX 40, such as a tank circuit with two series connected inductors and a capacitor or a tank circuit with 1 inductor and 2 series connected capacitors.

The TX 40 has the capability to measure the Q-factor of the tank circuit 48 when such measurement is deemed appropriate or necessary. For this purpose, the output of the tank circuit 48 is tapped using an electrical line 54 and applied to a sampling and sensing circuit 56. The sampling and sensing circuit 56 operates to appropriately condition a copy of the sinusoidal voltage $V_r$ received on the line 54 to make a resulting conditioned electrical signal 58 suitable for digital signal processing by a processor or microcontroller 60. In one embodiment, the signal conditioning performed by the sampling and sensing circuit 56 includes changing the amplitude of the sinusoidal voltage $V_r$ and adding a fixed DC offset voltage thereto. The sampling and sensing circuit 56 may also provide proper electrical isolation between the processor 60 and the resonant converter 42 in order for the electrical line 54 not to perturb the sinusoidal voltage $V_r$ and the output voltage $V_{out}$. The sampling and sensing circuit 56 may comprise a capacitor to which the electrical line 54 is connected, where the capacitor operates to provide DC isolation between the sampling and sensing circuit 56 and the tank circuit 48. In one embodiment, the capacitor has a capacitance that is significantly smaller than the capacitance of the capacitor(s) used in the tank circuit 48, which serves to reduce the influence of the sampling and sensing circuit 56 on oscillations of the tank circuit 48. One end of the capacitor is connected to a node between two series connected resistors that operate as a voltage divider of the sampling and sensing circuit 56 and apply a DC offset to the AC signal passed from the capacitor to the node between the resistors. A diode pair may be provided to clip the resulting dc-offset waveform from the capacitor when the amplitude of that waveform is very large. For example, if the resistors have the same resistance, then the diode pair will clip the dc-offset waveform from the capacitor when the amplitude of that waveform is greater than $V_{cc}/2$, where $V_{cc}$ is the power-supply voltage used in the sampling and sensing circuit 56. This feature of the sampling and sensing circuit 56 protects the downstream circuitry, such as an op-amp buffer and the controller 60, from possible unsafe signal levels. The output signal generated by the sampling and sensing circuit 56 (i.e., from an op-amp buffer having one input connected to the node between the resistors and the other input connected to its output) is the conditioned electrical signal 58 provided to the processor 60. The processor 60 can be implemented as a standalone or embedded microcontroller unit (MCU).

Figure 5:
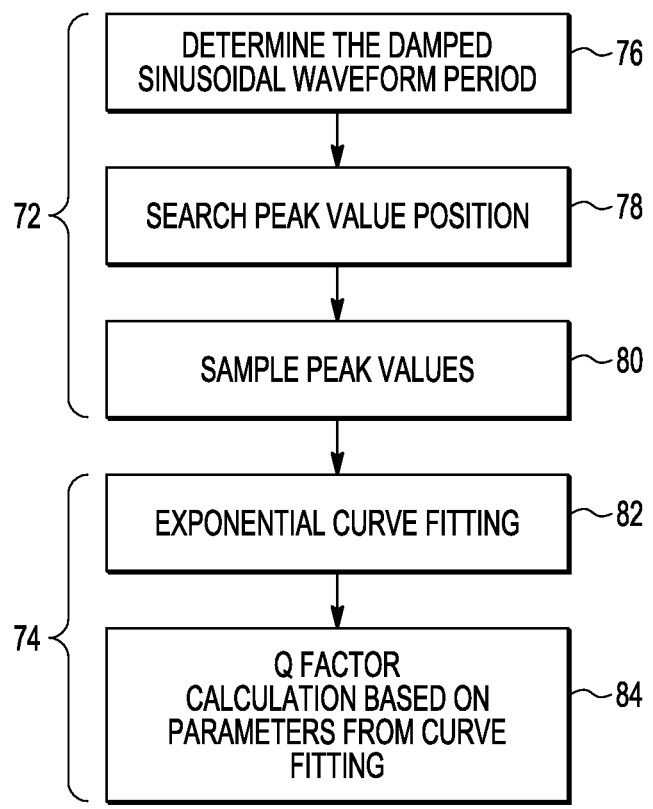
FIG. 5 is a flow chart illustrating a Q factor determination method performed by the processor of the transmitter of FIG. 3.

A method for determining the Q-factor of the tank circuit 48 that is implemented using the controller 60 is described in more detail with reference to FIG. 5, which is a flow chart 70 of the processing performed by the sampling and sensing circuit 56 and the processor 60 according to one embodiment of the invention. In the flow chart, the sensing circuit 56 performs the first three steps 76-80, which are grouped and indicated at 72 and the processor 60 performs the next two steps 82 and 84, which are grouped and indicated at 74. However, as will be understood by those of skill in the art, the processor may include circuitry such as an ADC and a comparator, which can be used for performing all or part of the steps 76-80.

At step 76, the sampling and sensing circuit 56 determines the period of the damped sinusoidal waveform generated by the switching network 46 (as previously described). The zero-crossing points of the waveform have the same interval. To obtain a more precise period, it is preferred to measure several period values between adjacent zero-crossing points, and then calculate an average, by searching peak value position—sampling in a range of the waveform with finer resolution to find the peak value at step 78. The peak value is generally located ¼ period after the zero-crossing point. Then at step 80, peak values are sampled, where after peak value position is located, a sequence of peak values with the same period is sampled.

At step 82, the processor 60 performs exponential curve fitting. The curve fitting may be done in the following manner. Assume the damped sinusoidal waveform is:

$$y = ae^{-bt}$$

We need to estimate b, which corresponds to the damping ratio of the waveform. The samples peak values are:

$$y(1) = ae^{-bt(1)}$$
$$\ldots$$
$$y(n) = ae^{-bt(n)}$$

Do logarithm:

$$\ln[y(1)] = \ln a - bt(1)$$
$$\ldots$$
$$\ln[y(n)] = \ln a - bt(n)$$

Substitute:

$$Y(n) = \ln[y(n)]; A = \ln a.$$
$$Y(1) = A - bt(1)$$
$$\ldots$$
$$Y(n) = A - bt(n)$$

Use least square method to estimate A and b:

$$b = \frac{\sum Y(n) \times \sum t(n) - n \sum (Y(n)t(n))}{n \sum t^2(n) - (\sum t(n))^2}$$

$$A = \frac{\sum Y(n) + B \sum t(n)}{n}$$

Finally, at step 84, Q factor calculation is performed by solving the following equation.

$$Q = \frac{\pi}{-\ln(b)}$$

By using the curve fitting method, Q factor can be calculated accurately in a noisy environment, where such accuracy cannot be achieved using traditional methods.

The present invention, generating Q factor using logarithmic curve fitting, is especially advantageous in a power-transmitter that supports 2 or more channels of charging, so has 2 or more sets of coils, because the coils generate magnetic waves that can interfere with each other, causing the damped sinusoidal waveform to be distorted and a calculated Q factor incorrect. By employing curve-fitting, the distortions are removed so the Q factor calculation is more correct.

The TX 40 uses the Q factor to determine whether or not an FO is present. If no FO is present, then the TX 40 will start the power transfer to the RX. If an FO is present, then the TX 40 will refrains from performing power transfer.

The processor 60 may be implemented using dedicated hardware as well as hardware capable of executing appropriate software. The functions of the processor 60 may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP), network processor, application specific integrated circuit (ASIC), and/or field programmable gate array (FPGA) circuitry. Other hardware, conventional and/or custom, may also be included.

Although the invention has been described in the context of a particular equations, those skilled in the art will understand that other equations can be implemented to achieve the same results of avoiding false positives (i.e., detecting FO removal when the FO remains) and false negatives (i.e., failing to detect FO removal), while achieving both true positives (i.e., correctly detecting FO removal) and true negatives (i.e., correctly detecting FO non-removal).

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims. It also will be understood by those of skill in the art that the described method can be used to calculate Q factor in noisy environments in fields not limited to wireless charging.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A node in a wireless charging system, the node comprising:
    a resonant circuit for coupling with another node inthe wireless charging system and receiving power from or transmitting power to the other node;
    a sample and hold circuit that plots a sinusoidal waveform generated by the resonant circuit; and
    a processor that (i) uses upper peaks and lower peaks of peak values of the sinusoidal waveform to perform exponential curve fitting between the upper peaks and the lower peaks of the peak values to generate a modified waveform, and (ii) calculates a Q factor value using data points from the modified waveform, wherein the calculated Q factor value is used to indicate whether a metal foreign object is present.

2. The node of claim 1, wherein the sample and hold circuit locates and samples peak value positions along the sinusoidal waveform.

3. The node of claim 1, further comprising a switching network connected to the resonant circuit for driving oscillations of the resonant circuit to generate the sinusoidal waveform.

4. The node of claim 3, wherein the switching network comprises a full bridge inverter.

5. The node of claim 1, wherein if a metal foreign object is present, then the processor halts either receiving or transmitting of power by the resonant circuit.

6. The node of claim 1, wherein the node comprises a power-transmitting node.

7. The node of claim 1, wherein the node comprises a power-receiving node.

8. A method for a node in a wireless charging system to determine the presence of a metal foreign object, themethod comprising:
    plotting values, by a sample and hold circuit, of a sinusoidal waveform generated by a resonant circuit of the node wherein the sample and hold circuit locates and samples peak value positions along the sinusoidal waveform;
    using the plotted values to generate an estimated sinusoidal waveform by a processor,
wherein the estimated sinusoidal waveform is a curve fitting between upper peaks and lower peaks of the peak value positions along the sinusoidal waveform;
    using values from the estimated sinusoidal waveformto calculate a Q factor value by the processor; and
    using the Q factor value to detect the presence ofthe metal foreign object.

9. The method of claim 8, further comprising exciting the resonant circuit using a switch network to drive oscillations of the resonant circuit to generate the sinusoidal waveform.

10. The method of claim 8, wherein if a metal foreign object is present, then the processor halts either receiving or transmitting of power by the resonant circuit.

11. The method of claim 8, wherein the node comprises a power-transmitting node.

12. The method of claim 8, wherein the node comprises a power-receiving node.

* * * * *